(12) United States Patent
Reed

(10) Patent No.: US 10,279,393 B2
(45) Date of Patent: May 7, 2019

(54) METHOD OF PRODUCING COPPER NANO PARTICLE COLLOIDAL DISPERSIONS

(71) Applicant: Kenneth J. Reed, Rochester, NY (US)

(72) Inventor: Kenneth J. Reed, Rochester, NY (US)

(73) Assignee: ZEROVALENT NANOMETALS, INC., Rochester, NY (US)

( * ) Notice: Subject to any disclaimer, the term of this patent is extended or adjusted under 35 U.S.C. 154(b) by 0 days.

(21) Appl. No.: 15/652,189

(22) Filed: Jul. 17, 2017

(65) Prior Publication Data

US 2018/0016154 A1    Jan. 18, 2018

Related U.S. Application Data

(60) Provisional application No. 62/363,591, filed on Jul. 18, 2016.

(51) Int. Cl.
*B22F 1/02* (2006.01)
*B22F 9/24* (2006.01)
(Continued)

(52) U.S. Cl.
CPC ......... *B22F 1/0022* (2013.01); *B01J 13/0026* (2013.01); *B01J 23/72* (2013.01);
(Continued)

(58) Field of Classification Search
CPC ........ B82Y 30/00; B82Y 40/00; C01G 3/003; C01P 2004/64; C07K 16/00; C07K 2317/21; C07K 2317/565; C07K 2317/567; C12N 15/1089; C40B 40/08; C40B 50/02; G01N 33/543

See application file for complete search history.

(56) References Cited

U.S. PATENT DOCUMENTS

| 6,197,366 B1 | 3/2001 | Takamatsu et al. |
| 7,335,245 B2 | 2/2008 | He et al. |

(Continued)

FOREIGN PATENT DOCUMENTS

JP    2011032558    2/2011

OTHER PUBLICATIONS

WO2015129466, Copper nanoparticles and a production method thereof, copper nanoparticle dispersion, copper nano-inks, sintering method storage method and copper nanoparticles copper nanoparticles.

(Continued)

*Primary Examiner* — Amber R Orlando
*Assistant Examiner* — Syed T Iqbal
(74) *Attorney, Agent, or Firm* — Tracy Jong Law Firm; Tracy P. Jong; Cheng Ning Jong

(57) ABSTRACT

The present process provides a method for synthesizing oxide-free copper nanometal dispersion in a free and reduced state using a solution phase synthesis process. A solution of an organic reducing agent containing at least two proximal nitrogen atoms is reacted with a separate solution containing a copper salt reformulated into a charge transfer complex. The reaction products are stabilized with Lewis bases and Lewis acids and optionally can be concentrated by removing a portion of the volatile low molecular weight solvent by either the use of a partial vacuum or by chemical extraction into another phase.

26 Claims, 5 Drawing Sheets
(4 of 5 Drawing Sheet(s) Filed in Color)

(51) Int. Cl.
*B22F 1/00* (2006.01)
*B82Y 30/00* (2011.01)
*C01G 3/00* (2006.01)
*B01J 13/00* (2006.01)
*B01J 35/00* (2006.01)
*C30B 7/00* (2006.01)
*B01J 37/16* (2006.01)
*B01J 23/72* (2006.01)

(52) U.S. Cl.
CPC ......... *B01J 35/006* (2013.01); *B01J 35/0013* (2013.01); *B01J 37/16* (2013.01); *B22F 1/025* (2013.01); *B22F 9/24* (2013.01); *B82Y 30/00* (2013.01); *C01G 3/003* (2013.01); *C30B 7/00* (2013.01); *C01P 2004/64* (2013.01)

(56) References Cited

U.S. PATENT DOCUMENTS

| | | | |
|---|---|---|---|
| 7,611,644 | B2 | 11/2009 | Shim et al. |
| 7,625,637 | B2 | 12/2009 | Kim |
| 7,749,300 | B2 | 7/2010 | Chretien et al. |
| 7,976,733 | B2 | 7/2011 | Chopra et al. |
| 8,017,939 | B2 * | 9/2011 | Joo .................. G11C 11/5664 257/40 |
| 8,088,485 | B2 | 1/2012 | Harutyunyan et al. |
| 8,404,160 | B2 | 3/2013 | Li et al. |
| 9,378,861 | B2 | 6/2016 | Zinn et al. |
| 2008/0278181 | A1 | 11/2008 | Zhong et al. |
| 2013/0288892 | A1 | 10/2013 | Lauterbach et al. |
| 2014/0009545 | A1 | 1/2014 | Carmody |
| 2014/0212497 | A1 | 7/2014 | Pikramenou et al. |
| 2015/0099172 | A1 | 4/2015 | Rowe et al. |

OTHER PUBLICATIONS

Lopez et al, WO2015082530, Process for preparing anisotropic metal nanoparticles and agent for controlling growth thereof.

Yu et al., Shape-controllable and versatile synthesis of copper nanocrystals with amino acids as capping agents, Nanoscale, 2015, 7, 8811, Received Jan. 8, 2015, Accepted Apr. 8, 2015, DOI: 10.1039/c5nr00146c.

Usman et al., Synthesis, characterization, and antimicrobial properties of copper nanoparticles, International Journal of Nanomedicine 2013:8 4467-4479.

Zhang et al., Facile Fabrication of Ultrafine Copper Nanoparticles in Organic Solvent, Received: Jan. 20, 2009 / Accepted: Mar. 24, 2009 / Published online: Apr. 10, 2009.

Hokita et al., High-Concentration Synthesis of Sub-10-nm Copper Nanoparticles for Application to Conductive Nanoinks, DOI: 10.1021/acsami.5b05542, ACS Appl. Mater. Interfaces 2015, 7, 19382-19389.

Magdassi et al., Copper Nanoparticles for Printed Electronics: Routes Towards Achieving Oxidation Stability, Materials 2010, 3, 4626-4638; doi:10.3390/ma3094626.

Zheng Hu, Yuanfu Hsia, Jianguo Zheng, Jianyi Shen, Qijie Yan, and Lemei Dai, A study of Fe—Ni—B ultrafine alloy particles produced by reduction with Borohydride, Journal of Applied Physics 70, 436 (1991).

David Thompson, dtthompson@aol.com, Michael Faraday's Recognition of Ruby Gold: the Birth of Modern Nanotechnology, His 1857 Lecture to the Royal Society in London, Gold Bulletin 2007 40/4, pp. 267-269.

G.N. Glavee, K. J. Klabunde, C. M. Sorensen, and G.C. Hadjipanayis, Sodium Borohydride Reduction of cobalt Ions in Nonaqueous Media. Formation of Ultrafine Particles (Nanoscale) of Cobalt Metal, Inorg. Chem. 1993, 32, 474-477, Aug. 25, 1992.

Ajeet Kumar, Amit Saxena, Arnab De, Ravi Shankara and Subho Mozumdar, Facile synthesis of size-tunable copper and copper oxide nanoparticles using reverse microemulsions, RSC Advances, RSC Publishing, The Royal Society of Chemistry 2013, RSC Adv., 2013, 3, 5015-5021.

* cited by examiner

NO SABILIZER BLANK CONTROL     Cu²⁺ LIGAND 1,2 DIAMINOPROPANE     Cu⁰ LIGAND 1,10 PHENANTHROLINE

BiPy 1.1:1 Ratio    BiPy 1.5:1 Ratio

No stabilizer    1,10 Phenanthroline

US 10,279,393 B2

METHOD OF PRODUCING COPPER NANO PARTICLE COLLOIDAL DISPERSIONS

PRIORITY CLAIM AND RELATED APPLICATIONS

This non-provisional application claims the benefit of priority from provisional application U.S. Ser. No. 62/363,591 filed on Jul. 18, 2016. Said application is incorporated by reference in its entirety.

BACKGROUND OF THE PROCESS

1. The Field of the Process

This process relates to the synthesis and stabilization of copper metal-containing nanoparticle colloidal dispersions. More specifically, this process relates to an improved, low temperature, chemical solution phase synthesis of copper and the stabilization of its associated colloidal metal.

2. Background Art

There is considerable interest in the synthesis and chemical/physical properties of small metal particles and their alloys in the nano-domain where particle sizes are less than 100 nanometers. Application in the areas of photonics, medicine, coatings, additive manufacture and printable electronics are viewed as especially attractive commercial venues for these materials. Among the many synthetic routes to these materials, solution phase reaction is an especially straight-forward, economical and versatile method that also provides facile compositional materials engineering and particle size control. In one embodiment of this technique, metal particles are generated by the reduction of an organic metal salt in a solution phase (aqueous or organic) by a reducing agent with concurrent stabilization of the metal colloidal suspension with a chemical "capping agent" or stabilizer. Stabilizers can carry a formal electronic charge or not or can belong to a class of molecules called surfactants (composed of lipophilic and hydrophilic moieties). Generally, capping agents, ligands, "ligate" or bond to the underlying metal with something less than a two electron bond.

A considerable amount of technical and patent literature has evolved around this technique with particular emphasis on the noble metals group (Platinum, Gold, Silver, Rhodium, and the like) as these materials, even in the nano-state, are resistant to aerial oxidation. Their electrochemical reduction potentials occur at large, positive voltages so the forward reaction $M^{2+}+2e^-\rightarrow M^0$ is favored by a robust, spontaneous negative free energy change. For example the $E^0$ of Au is 1.692 volts and that of Pt is 1.18 volts.

Unfortunately, this is not the case for most of the period 4 and 5 transition metals such as Ti, Fe, Co, Ni, Cu, Zn, as the opposite situation prevails. Their $E^0$s are either small positive values or are negative and large in magnitude ($E^0$ Ti=−1.63 V, $E^0$ Ni=−0.25 V, $E^0$ Cu=+0.34 V and $E^0$ Zn=−0.76 V), which means the backward or oxidation reaction $M^0\rightarrow 2e^-+M^{2+}$ is highly favored. Thus, it is difficult to find or synthesize these metals in a free and reduced state, as they are more commonly found as oxides due to the ease with which they combine with oxygen. The ubiquitous materials paint (i.e., $TiO_2$), sunscreen (i.e., ZnO), and red ($Cu_2O$) or black (CuO) are commonly encountered examples of these oxides.

In the preparation of fully reduced, referred to as "zero valent," nano-metals, it is common practice to use very high concentrations of polymeric ligands (molar ratios of >15:1 of organic stabilizer:metal) present in the metal cation reduction step to both sterically and electrostatically stabilize the resulting colloidal dispersion (to prevent agglomeration settling) and to provide a protective sheath that excludes, to varying extent, oxygen from the metal particle surface. This high concentration regime becomes more extreme when high particle loadings are desired—usually in the range that is equal to or greater than 20%. Herein lies the crux of the problem. Having stabilized the colloidal suspension with large quantities of complex organic molecules, the subsequent intended use of the material (conductive trace, Radio Frequency Identification (RFID) tags, catalyst, coating, and the like) requires one to use extreme conditions of heat or light, long times or complex and involved reaction sequences to remove the protective sheath and render the metallic material reactive and useful for its intended purpose. This type of stabilization will be referenced herein as "thermodynamic stabilization" and it usually provides stability against settling and oxidation for periods of months. The opposite approach to this method could be called "kinetic stabilization" which requires better mixing, occurs with rapid reaction times and lower temperatures. Kinetic stabilization works for periods of days, allows for, and perhaps requires, subsequent chemical functionalization of the particle surface.

A very complete and recent review of copper and copper based nanoparticle synthesis with application to catalysis is given by Gawande et al. in *Chem. Rev.* 2016, 116, 3722-3811. Table 1 contains 107 entries detailing wet chemical methods (solution reaction chemistry) and covers: solvents (e.g., water, acetone, ethanol, proanediol), stabilizers (oleic acid, olylamine, polyvinyl pyrrolidone, polyethylene glycol, aerosol OT—a surfactant), reducing agents (hydrazines, sodium borohydride, ascorbic acid, glucose), copper chemical precursors (halides, acetates, nitrates, sulfates, acetylacetates) and thermal treatment conditions (usually ~100 degrees Celsius, for an hour or so). Additionally, the review of Tan and Cheong, *J. Nanopart Res* (2013) 15:1537, discussed both copper and silver synthetic routes and focused exclusively on chemical reduction. They categorized the stabilizers as: polymers or surfactants (Triton X-100, Tween 20, PVP, PVA, Sodium Dodecyl Sulfate, etc.), acids (mercaptoacetic acid, sodium citrate, EDTA, stearic, cholic) amines (oleylamine, pheylenediamine, aminosilane), bromides (CTAB, DTAB, TTAB, TBAB), ligands (thiolates, sulfonates), alcohols (isopentanol, dodecanethiol) and silicates (Laponite).

Specific literature and patent examples of commonly used named stabilizers or capping agents include: PVP (Zhang et al. *Nanoscale Res Lett* (2009) 4:705-708"*Facile Fabrication of Ultrafine Copper Nanoparticles in Organic Solvent*"), surfactants (discussed above), alcohols (Kawaska et al. WO 2015129466 A1), diols and ether alcohols (Kurihara et al. U.S. Pat. No. 7,033,416 B2, Apr. 25, 2006), amines (U.S. Pat. Pub. No. 2015/0099172 A1, Apr. 9, 2015"Synthesis of Metal Nanoparticles"), polyethylene amines (Quiintea et al. WO2015082530 A1, 2015), amino acids (Yu et al. *Nanoscale*, 2015, 7, 8811), carboxylic acids (Abe et al. JP 2011032558 A 20110207, 2011), and dithiacarbonates (Chopra, et al. U.S. Pat. No. 7,976,733B2). Zhong et al. in US 2008/0278181A1 use a combination of surfactants, oleyic acid and oleyl amine as capping agents in the high temperature (>145 degrees Celsius) and extended time (~30 min) synthesis of claimed oxidation resistant copper nanoparticles 5 nm and greater. It should be noted that a separate isolation and re-suspension step was required to make the final dispersion. The inventors Alfred Zinn and P. Lu in U.S. Pat. No. 9,378,861 B2 uses an amine surfactant of carbon chain length C6-C18 and a ligand N,N'-dialkylethylenediamine to stabilize Cu nano particles with a poly disperse 1-10 nm size-frequency distribution. No direct sizing data are provided, other than a 100 nm scale TEM, although the preferred size range is claimed to be 3-5 nm. These Cu nanoparticles are deemed to be metastable and have been previously formed in the presence of the alkylated ethylenediamine reducing agent at low temperature (<60 degrees Celsius). However, the particles sinter or "fuse" into a conductive circuit element in the 100-200 degrees Celsius temperature range and under pressure (<95 PSI) which is claimed to not cause additional heating. Thus a combination of both pressure and temperature are required for fusing the nanoparticles.

Interestingly, short organic chain copper precursors (glycolates and separately copper acetate with formic acid and cyclohexylamine) have been described in RSC Adv., 2014, 4, 60144 by Wen-dong Yang, et al. however, these inks require very high temperatures (~220 degrees Celsius and 290 degrees Celsius) to achieve reasonable electrical conductivity.

The naturally occurring polymer chitosan (Usman et al. Int. J. Nanomedicine 2013:8 4467-4479) is an interesting and economical material but is difficult to use due to its limited solubility in most practical solvents. The use of negatively charged stabilizers such as carboxylic acids, poly acrylic acid, EDTA and the like is fraught with difficulties as the stabilizer will bind much more strongly to the starting metal cation (positively charged precursor) than it will to the final fully reduced metal, thereby thwarting the reduction process. This antagonistic and undesired effect can be overcome by the brute force application of extremely excessive reducing agent levels (greater than 10× the required stoichiometric amount) to bias the reaction towards the production of the desired product, zero valent metal.

Bi-dentate capping agents (not surfactants) feature two metal binding sites on the stabilizer molecule usually in close proximity (<4 atoms removed from each other). Prominent among these are the bis-nitrogen materials 1,10 phenanthroline. In U.S. Pat. No. 7,335,245 B2 He et al. Honda Motor Feb. 27, 2008"*Metal and Alloy Nanoparticles*" teaches multicomponent metal alloys invariably incorporating a noble metal, are supported on a carbonacious material, and are heated to several hundred degrees Celsius in a high temperature boiling solvent. Other bidentate containing materials featuring two nitrogens are bipyridine (BiPY) derivatives (US 2014/0212497 A1 Pikramenou et al. Jul. 31, 2014"*Coated Nanoparticles*" teaches a composite nanoparticle in which a first noble metal nanoparticle is functionalized by at least one type of metal complex and surfactant. The preferred metal complexes are those of Ir or Ru and combined with various derivatized bipyridines ("BiPY") and phenanthrolines).

The limitations of these approaches are the obvious cost and scarcity of the precious metals involved and the financial and time expense of making "boutique" derivatized BiPY or phenanthroline compounds. It is not clear that the derivatized materials offer that much more benefit than the parent compounds. Off-the-shelf diamines, whose nitrogen atoms are located not immediately adjacent (as in 1,2) but in a 1,3 or 1,5 or even 1,7 disposition is described by H. Takamatsu in U.S. Pat. No. 6,197,366 B1 (2001) in for the formation of coatable, viscous, and homogeneous metal containing pastes. Very high temperature (>300 degrees Celsius) processing and long times (~5-10 minutes) were required to achieve pure metal film strips.

Nitrogen atom-containing molecules are not the only bi-dentate materials. The bi-dentate binding sites of a capping agent could feature two different atoms as is the case for the aminopropanol. Hokita et al. in *ACS Appl. Mater. Interfaces* 2015, 7, 19382-19389 describes the use of 1-amino 2-propanol and 1-amino 3-propanol as capping agents in the production of copper based inks. Very high levels of capping agent relative to the amount of metal copper were employed (a 10:1 molar ratio was cited) as were high levels of the reducing agent hydrazine (10:1 which is a 19 fold excess on an electron equivalent stoichiometric basis) which yielded, upon sintering a fairly electrically resistive trace, 30 microohm-cm after a prolonged heating time of 15 minutes at high, 150 degrees Celsius, temperature. For comparison, the bulk resistance of un-annealed copper is 1.68 microohm-cm. Other variants on the amino-alcohol capping agent theme are; Suguiyama et al. *J. of Mat. Sci.: Materials in Electronics* 2016 who show that 2-amino-1-butanol as a capping agent has superior copper adhesion properties to polyimide films relative to the above cited amino propanols, Farraj et al., *Chemical Communications* (Cambridge, United Kingdom) 2015, 51 (9)1587-1590 who claim that 2-amino-2-methyl-1-propanol capped copper inks only require 140 degrees Celsius under a N2 blanket to cure on a flexible substrate and finally that a N2 blanket is not required to prevent oxidation during the curing of a 3-dimethylamino-2-propanol or dimethyl ethanolamine capped copper ink as reported in by Kang et al. in *Repub. Korean Kongkae Taeho Kongbo* 2014 KR2014111070 A20140918.

Various strategies to mitigate the extent of oxidation for copper nanoparticles (in particular) are discussed in *Materials* 2010, 3, 4626-4638 by Magdassi et. al. Essentially they involve putting a protective coating on the particles thereby making a core:shell structure. The copper coatings on these particles are: organic polymers (whose limitations have already been discussed), carbon or graphene, or an inert material such as silica or metal (typically binary combinations of Au, Pt, Ag, Pd). The precious metal shell approach to oxidation resistance suffers from obvious cost limitations. Specific core-shell patents are: Shim et. al. U.S. Pat. No. 7,611,644 B2 Nov. 3, 2009 which claims a precious metal shell technology; Chretien et. al. U.S. Pat. No. 7,749,300 B2 Jul. 6, 2010 claims a photochemical method of making a bi-metallic core-shell nanoparticle; Lauterbach et al. U.S. Pat. Pub. No. 2013/0288892 A1 Oct. 31, 2013 teaches core-shell nanoparticle synthesis under a reducing gas environment; Kim et al. U.S. Pat. No. 7,625,637 B2 December 2009 teaches metal nanoparticles formed from low reduction potential metals (core shell structures with silver and palladium at the core and nickel shells) and finally Harutyunyan et al. U.S. Pat. No. 8,088,485 B2 claims that alumina or silica supported metal alloyed nanoparticles can be formed by heating a mixture of metal acetates in passivating solvents such as glycol ethers or 2-(2-butoxyethoxy) ethanol.

It should be noted that care needs to be taken in accepting the conclusions that fully reduced metal particles were synthesized in works where the identity of the nanoparticle has not been established, by either electron diffraction, x-ray diffraction or visible spectroscopy (usually by the observation of a 580 nm absorption peak in the case of copper, see, G. Mie Ann. *Phys* (Liepzig) 1908, 25,377). False product identification may be a problem when sodium borohydride is used as the reducing agent, as it is well known that the borides $CrB_2$, $Co_2B$ and $Ni_2B$ and by extension CuB, are readily produced by this reducing agent. Subsequent sintering will produce a broate or boric oxide coating which is a very good electrical insulator.

Metal ink formulations using aliphatic alcohols that are can be sintered by heat or light are described for wet coating applications, Li et al. in U.S. Pat. No. 8,404,160 B2 Mar. 26, 2013 or for jetting applications which use a combination of alcohols, diols and glycols and require specific surface tension and viscosity values, see M. Carmody in U.S. Pat. Pub. No. 2014/0009545 A1 Jan. 9, 2014. Again the limitation herein is the need for a high power laser to sinter the copper ink that has been previously applied to a surface, into a highly electrical conducting pattern or trace.

Despite the advances in the art, there is clearly a need for stabilization strategies and chemistries that facilitate the use of the as-made metal nanomaterials that does not require large quantities of complex organic polymeric molecules or excessive amounts of reducing agents while still providing high suspension density materials with good low temperature sintering properties that are reasonably electrically conductive.

SUMMARY OF THE PROCESS

The present process provides a method for synthesizing and stabilizing difficult to make oxide-free copper in a free and fully reduced state using a facile solution phase synthesis process that does not require de-aeriation. Also provided is a method for stabilizing the associated copper colloidal metal dispersion synthesized under kinetic control at modest temperatures (<80 degrees Celsius). A solution of an organic reducing agent containing at least two proximal nitrogen atoms, either neat or in a solvent is reacted with a separate solution containing one or more metal-organic salts dissolved in the same or different low molecular weight solvent as the reducing agent and form a charge transfer (CT) ligand-to-metal complex. This copper CT complex stabilizes the copper cation, $Cu^{2+}$ reagent against aerial oxidation. The pure copper reaction product nanoparticle is stabilized prior to the reduction step with the addition of a bi or polydentate Lewis base that preferentially binds to the reduced copper, $Cu^0$. Optionally, after the reduction step, additional stabilization may be effected with the addition of one or more Lewis acids. The metal product may, optionally, be concentrated by removing a portion of the volatile low molecular weight solvent by either the use of a partial vacuum or by chemical extraction into another phase. In certain embodiments, with high reactant suspension densities, there is no subsequent concentration or product processing (distillation, filtration, or extraction). This copper nanoparticle reaction is then called a "one-pot" synthesis of copper.

It is an object of this process to kinetically stabilize for a useful period of time, colloidal copper nanoparticle dispersions with small molecule Lewis and Bronsted bases such as mono, bi and tri-dentate amines and aminoalcohols. These small molecule, non-polymer capping agents or stabilizing agents can be employed at relatively low levels with respect to the metal, for example, less than 4:1 molar ratio of stabilizer to metal and in some cases as low as 1:4. In addition to facilitating their removal (low temperature and short times), these low levels of stabilizer greatly improve the economics of producing the dispersion in addition to removing any concerns of introducing aerial oxidation into the dispersion work-up.

It is an additional object of this process to provide Lewis acid stabilizers such as boric acid and alkyl or aryl borates as adjuvant stabilizing molecules, administered post nanoparticle formation, to further extend the period of stability and facilitate subsequent chemical and physical manipulation of the colloid. Both adjuvant and initial capping agents alone or in combination can be used in a manner after the reduction step to terminate particle growth and thereby control final nanoparticle size. This two stage (dual) stabilization strategy provides an alternative to, and obviates the need for, thermodynamic stabilization using polymeric and large molecule chemistry at high concentrations (greater than a 10:1 organic:metal atomic ratios).

Additionally, the adjuvant Lewis acid chemistry provides protection against aerial oxidation and facilitates sintering (by lowering surface tension) and melting of the particles when exposed to sufficient heat (thermal) or light (photonic) curing. This aids in the production of high thermally and electrically conductivity coatings or patterns.

A further object of this process is to enable the synthesis of difficult to make oxide-free copper nanometal using appropriate aqueous and non-aqueous aminoalcohol solvent systems.

It is also an object of this process to characterize a "one pot" synthesis in which the ancillary chemical steps needed to isolate and clean up the synthesized post reaction product are eliminated by the judicious choice of chemical reaction media (solvents), chemical reactants and stabilizing chemistry.

Whereas there may be many embodiments of the present process, each embodiment may meet one or more of the foregoing recited objects in any combination. It is not intended that each embodiment will necessarily meet each objective. Thus, having broadly outlined the more important features of the present process in order that the detailed description thereof may be better understood, and that the present contribution to the art may be better appreciated, there are, of course, additional features of the present process that will be described herein and will form a part of the subject matter of this specification.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

In order that the manner in which the above-recited and other advantages and objects of the process are obtained, a more particular description of the process briefly described above will be rendered by reference to specific embodiments thereof which are illustrated in the appended drawings. Understanding that these drawings depict only typical embodiments of the process and are not therefore to be considered to be limiting of its scope, the process will be described and explained with additional specificity and detail through the use of the accompanying drawings in which.

PARTICULAR ADVANTAGES OF THE PROCESS

Figure 1:
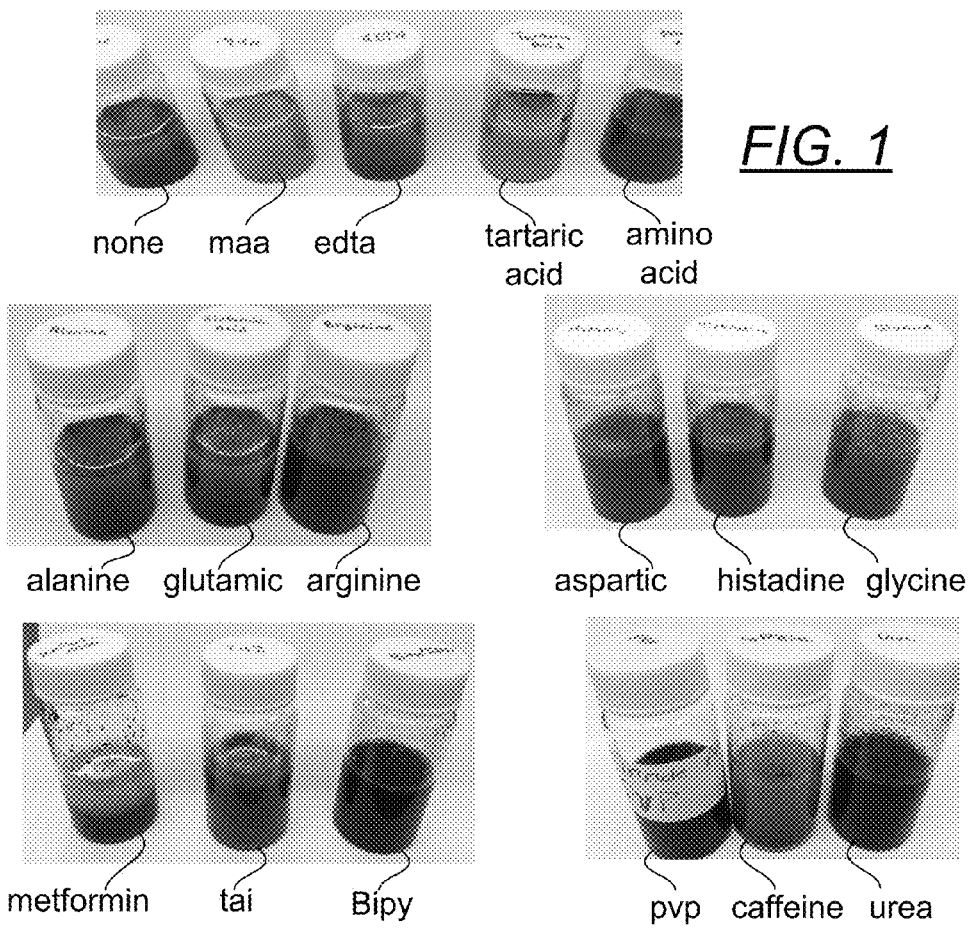
FIG. 1 depicts copper colloidal dispersions made in a variety of suspected stabilizers: none, maa, edta, ascorbic acid, tartaric, various amino acids, metformin, TAl BiPY, PVP, caffeine and urea.

The present process provides a method for synthesizing difficult to make oxide-free copper nanometal in a free and reduced, zero valent state.

The present process provides for the use of preferred (charge transfer) reagents acting as solvents for the oxidized starting materials and the final, fully reduced copper metal thus mitigating the need for auxiliary solvents and enabling high suspension density metal colloids.

The present process kinetically stabilizes colloidal reduced copper nanoparticle dispersions with small molecule Lewis and Bronsted bases such as mono, bi and tri dentate amine and aminoalcohol charge transfer agents for the stabilization of the starting copper salt. This chemistry provides protection against aerial oxidation during synthesis and minimizes or eliminates the ancillary chemical steps needed to isolate and clean up the synthesized reaction products enabling a "one pot" synthetic process.

The present process reduces the quantity of non-polymeric capping agents and stabilizing agents used in the production of high suspension density materials with good low temperature sintering properties to lower than a 2:1 molar ratio of stabilizer to metal.

The present process provides adjuvant molecules, commonly, Lewis acids, such as boric acid or alkyl borates administered post nanoparticle formation, to further extend the period of stability and facilitate subsequent chemical and physical manipulation of the colloid such as sintering.

The present process provides an alternative to, and obviates the need for, thermodynamic stabilization which relies on polymeric and large molecule chemistry used in high concentrations (usually greater than a 10:1 organic:metal atomic ratios).

The present invention identifies di amino reducing agents that enable the formation of nanoparticles of less than 3 nm in geometric diameter.

The present process provides protection against aerial oxidation and facilitates sintering and melting of the metal or alloy particles when exposed to heat (thermal) or light (photonic) curing, an advantage in the production of high thermal and electrical conductivity coatings or patterns.

The use of kinetic stabilization as opposed to thermodynamic stabilization eliminates the need for extreme conditions of heat or light, long times or complex and involved reaction sequences to remove the protective sheath and render the metallic material reactive and useful for its intended purpose.

Definitions of Terms Used in this Specification

As used in this specification, the term nanoparticles shall mean particles that have at least one dimension that lies between 1 and 100 nanometers.

As used in this specification, the term low molecular weight solvent shall mean a solvent with a molecular weight of less than 120 atomic mass units, amu.

As used in this specification, the term metal organic salt shall mean compounds consisting of metal ions or cluster coordinated to organic ligands displaying intense colors (charge-transfer complexes) that form two-, or three-dimensional structures.

As used in this specification, the term quenching agent shall mean a chemical that tends to severely inhibit or stop the reaction between two or more other chemicals.

As used in this specification, the term Lewis acid shall mean an electrophilic compound that can accept a pair of electrons and form a coordinate covalent bond.

As used in this specification, the term Lewis base shall mean a chemical or compound that donates a pair of electrons to a metal, or optionally, to a Lewis acid.

As used in this specification, the term capping agent shall mean the same as a stabilizing agent and is a chemical or compound that adsorbs to nanoparticle surfaces and stabilizes them against agglomeration or aggregation.

As used in this specification, the term reducing agent shall mean is an element or compound that loses (or "donates") one or more electrons to another chemical species in a redox chemical reaction. Organic reducing agents contain organic compounds or elements.

As used in this specification, the term adjuvant molecule shall mean molecules or agents that modifies the effect of other agents.

As used in this specification, the term facile solution phase synthesis means a simple (i.e., no complicated equipment), low temperature (<60 degrees Celsius), and rapid synthesis (minutes not hours) that does not require extensive work-up (separations, filtration) of the reaction products.

DETAILED DESCRIPTION OF A PREFERRED EMBODIMENT

The term "about" is used herein to mean approximately, roughly, around, or in the region of. When the term "about" is used in conjunction with a numerical range, it modifies that range by extending the boundaries above and below the numerical values set forth. In general, the term "about" is used herein to modify a numerical value above and below the stated value by a variance of 20 percent up or down (higher or lower).

The present process provides a method for synthesizing difficult to make oxide-free copper nanometal dispersions in a free and reduced state. These nanoparticle or colloidal dispersions can be generated by the reduction of an organic metal salt in a solution phase (aqueous or organic) by a reducing agent with concurrent stabilization of the metal colloidal suspension with a chemical "capping agent" or stabilizer. This process reduces the quantity of non-polymer capping agents and stabilizing agents used in the production of high suspension density materials with good low temperature sintering properties to as low as 2:1 molar ratio of stabilizer to metal. That is to say one mole of metal will have bound to it four or fewer moles of stabilizer, or one metal molecule to four stabilizer molecules on a molecular basis.

In one embodiment, metallic copper nanoparticles be synthesized by reacting an organic reducing agent either neat or dissolved in a low molecular weight solvent (<120 amu) with a separate solution comprising at least one metal-organic salt dissolved in a low molecular weight solvent until the organic reducing agent is exhausted. The organic reducing agent preferably has at least two nitrogen atoms disposed in close spatial proximity to one another. In this sense, close spatial proximity means having less than four atoms separating the two nitrogen atoms in the molecule. Hydrazine $N_2H_4$ is a preferred reducing agent as it produces $H_2$ (the reducing agent) and $N_2$ (which escapes into the atmosphere). Typically, the reducing agent concentration is twice to four times the stoichiometric amount needed to reduce the metal completely as there are losses of $H_2$ into the atmosphere.

The reaction may occur under kinetic control at a temperature less than about 80 degrees Celsius, preferably less than 60 degrees Celsius and more preferably less than or equal to about 40 degrees Celsius. The reaction temperature is preferentially kept low so as to not volatilize the low molecular weight reagents out of the reaction zone. The boiling point of methanol is 64.7 degrees Celsius while that of ethanol is 78.4 degrees Celsius.

A Lewis base (an electron donating molecule) used as a stabilizer may be present during the reduction step or added to the reaction shortly after exhaustion of the reducing agent. The time at which this stabilizer is added after the reduction has ended, will influence the final particle size. If the Lewis base stabilizer is present during the reaction, its level and binding strength will also affect the final particle size. Higher stabilizer concentrations and stronger particle-binding energy of the stabilizer to the particle will tend to produce smaller sized final particles. The preferred Lewis bases have at least two nitrogen atoms in close proximity to each other (close being defined as less than four atoms removed) and are usually bi-dentate. Specific classes of Lewis bases are organic diamaines such as 2,2' bipyridine; 1,10 phenanthrroline, N,N dimethyl formamide, urea, phenidone and derivatized phenidones, pyridine, substituted pyridines, ortho-phenylenediamines, aminoalcohols such as ethanolamine, 2-amino phenol, 8'-hydroxyquinoline or combinations of these chemicals. Of the amino acids, arginine, and histadine perform the best as stabilizers at low concentrations (~2:1 of stabilizer to metals ratio).

The preferred reducing agents have similar nitrogen atom disposition as the Lewis bases and in fact also act to some limited degree as stabilizing agents.

While the Lewis base is not affected by the reducing agent and therefore can be present in the reduction step, certain Lewis acids or adjuvant stabilizers, on the other hand, will react vigorously with most reducing agents, most notably the alkyl or aryl borates. Curiously, boric acid is the exception to this rule. Thus, this second stage of the stabilization process must come after the reducing agent is exhausted. The Lewis acid can be a boric acid or an organic (alkyl) borate, or a combination of these. If desired, the product can be concentrated by removing a portion of the volatile low molecular weight solvent to produce a metallic nanoparticle or nano-alloy colloidal dispersion. The solvent can easily be removed by gentle heating in a partial vacuum, chemical extraction into another phase, ultrafiltered or diafiltered to move unwanted volatiles or even complexed into the organic layer surrounding the metal particles. High percent solids (that is, metal and metal alloy compositions that are essentially solvent or continuous phase-free (80% metal) can be achieved most readily by solvent extraction of the metal particles into an organic phase of very low volume.

Other parameters that can be manipulated for controlling particle size, in addition to a post reduction step that terminates or quenches particle growth are; temperature (high temperatures tend to produce larger particles) and stabilizer concentration (low stabilizer concentrations Ie<1.5:1 stabilizer molecule to metal molecular tend produce larger particle sizes).

The present process provides adjuvant molecules, administered post nanoparticle formation, to effect particle size control and to further extend the period of stability of the colloidal dispersion. Certain Lewis acids act as these adjuvants, such as for example, boric acid or alkyl or aryl borates, and also facilitate subsequent chemical and physical manipulation of the colloid such as facile (low temperature, i.e. <150 degrees Celsius) sintering and forming highly conductive electrical patterns or traces.

The copper organic salt is preferentially an acetate, formate, citrate, and combinations of these salts. Formates are preferred as they are highly water soluble and the residual formate ion can act as a reducing agent during the sintering step, thereby protecting the work from aerial oxidation.

The organic reducing agent can be a reducing agent such as a hydrazine, aquated hydrazine, derivatized hydrazine, phenidone, derivatized phenidone, orthophenylenediamine or combinations of these.

The low molecular weight solvent can be water, methanol, ethanol, methoxy propanol, 1-amino 2 propanol, 1-amino 3-propanol and combinations of these. The amino alcohols help to chelate the metal cation and inhibit it from forming an oxide during reactions that are carried out in water. Otherwise non-aqueous solvent systems must be employed. Low molecular weight solvents are in general preferred as they can be removed from the reaction at modest temperatures and under reduced atmospheric pressure.

The present process kinetically stabilizes colloidal copper metal and nanoparticle dispersions with small molecule Lewis and Bronsted bases such as mono, bi and tri dentate amine ligands such that it minimizes or eliminates the ancillary chemical steps needed to isolate and clean up the synthesized post reaction products. Dispersions can be formulated that are >20% solids in a "one pot" reaction where no additional filtration or physical separation methods are required. Thus, the present process provides an alternative to, and obviates the need for, thermodynamic stabilization using polymeric and large molecule chemistry at high concentrations (greater than a 10:1 organic:metal atomic ratios). It also provides protection against aerial oxidation and facilitates sintering and melting of the particles when exposed to heat (thermal) or light (photonic) curing, an advantage in the production of high thermal and electrical conductivity coatings or patterns. The use of kinetic stabilization as opposed to thermodynamic stabilization eliminates the need for extreme conditions of heat or light, long times or complex and involved reaction sequences to remove the protective sheath and render the metallic material reactive and useful for its intended purpose.

Example 1

Example 1 exemplifies the results of a series of experiments screening various candidate stabilizers. A five ml aliquoit of a 0.1 M solution of $CuCl_2$ $2H_2O$ (0.5 mmole) in ethanol was placed into each of nineteen 20 ml scintillation vials. To each vial was added 1 mmole of a different stabilizer dissolved in 7 ml of ethanol. Then 2 millimoles of $NaBH_4$ (76.6 mg) were added with stirring to observe which compounds produced copper particles, how fine or coarse the particles were and whether the particles were suspended or not. The compounds in the FIG. 1 vials fall into three categories of stabilizers for metallic copper—good, moderate to poor and very poor or non-stabilizer. The good stabilizers included ascorbic acid and PVP (which were already known), as well as urea, 2,2'-bipyridine (i.e., BiPY) and benzimidazole. The moderate to poor stabilizers included carboxylic acids such as EDTA (large particles), tartaric acid (brown large particles) and the amino acids alanine, glutamine, arginine and histadine. The very poor or non stabilizers included MAA, i.e., methoxy acetic acid (green color, MAA did not allow copper reduction) aspartic acid, glycine, metformin, tetra azaindine and caffeine.

The experiment with the candidate stabilizers from these experiments were repeated using a mixed solvent of water (for the copper salts) and ethanol for the stabilizers. In this solvent system, the good stabilizers were the same but may also include histadine and arginine. The remaining stabilizer candidates were marginal to very poor.

Example 2

We had concerns that the reducing agent sodium borohydride was giving a copper boride adduct and not fully reduced copper, and so the next set (FIG. 2) of experiments were carried out with hydrazine, $N_2H_2$ (which oxidizes to nitrogen and hydrogen gas). The use of a chloride anion for the copper salt provides Cl— in the reaction, which over time, drops the pH of the system very low and the reduced metal becomes oxidized. Thus, the copper salt of choice became the acetate which did not suffer this problem.

Figure 2:
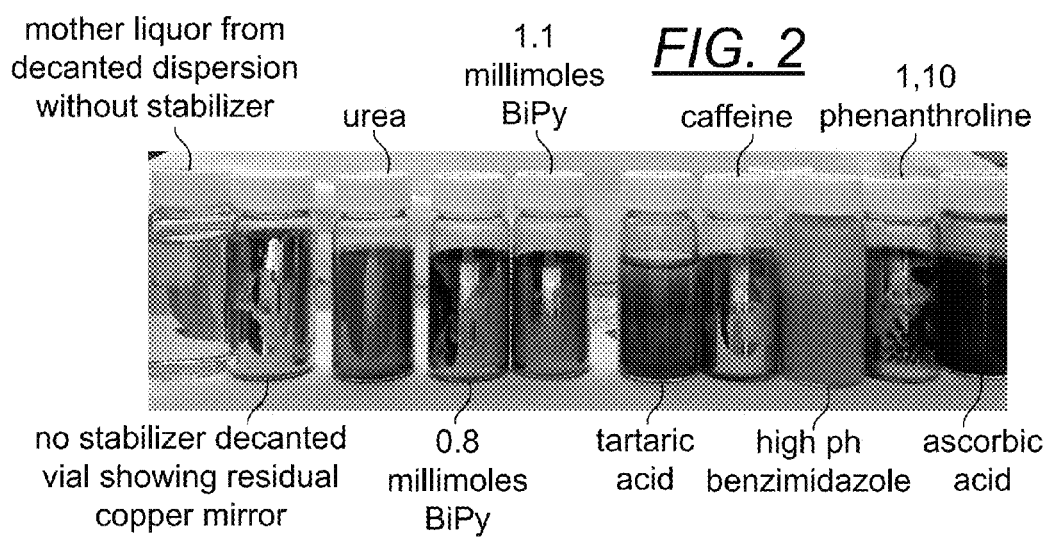
FIG. 2 depicts two day keeping of the stabilizers tested in FIG. 1: no stabilizer, decanted reaction showing a copper mirror, urea, BiPY 0.8 mmole, and BiPY 1.1 mmole, tartaric acid, caffeine, high pH benzimidazole, 1,10-phenanthroline and ascorbic acid.

Into a 20 ml scintillation vial were placed 1 mmole of copper acetate (200 mg in six ml of 18 megaohm deionized water). Six ml of isopropyl alcohol and six ml of propylene glycol were also added to the vial as well as 1.1 mmole of various selected stabilizers. The reduction was carried out by 2.5 mmoles (0.5 ml) of a 35% hydrazine solution. FIG. 2 displays the results obtained two days after the initial reaction.

The no stabilizer control (first two vials) printed out a copper band (copper mirror) lining the vial in a short time (small copper particles that are highly reactive). The next vial, urea, shows some stability and some copper mirror. The BiPY at 0.8 mmoles and 1.1 mmoles showed much less print-out (that is, more stability than the no stabilizer control). The tartaric acid showed considerable settling while caffeine provided some stability and some printout. The high pH benzimidazole flocculated while the 1,10-phenanthroline contained some copper mirror printout. The ascorbic acid appeared to be stable after two days.

Example 3

Figure 3:
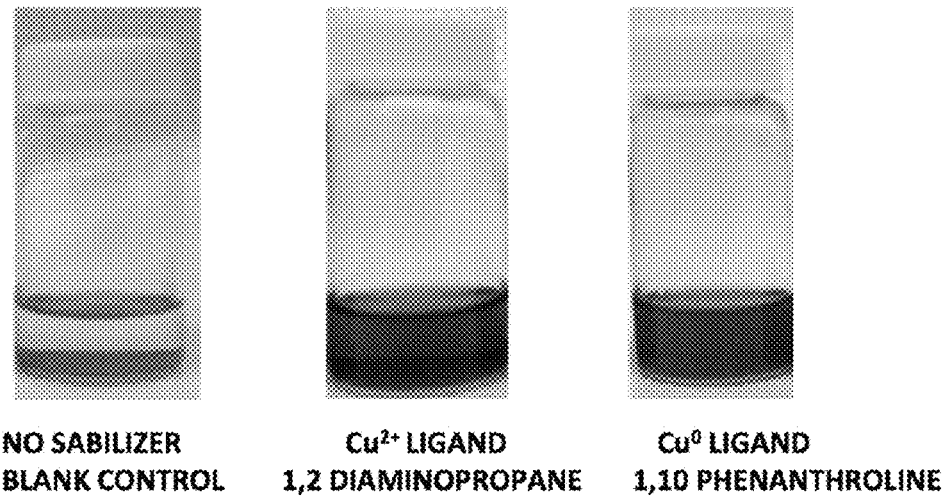
FIG. 3 depicts the three representative classes of molecular behavior observed when a candidate stabilizer is attempted to re-disperse reduced 1-5 um copper flakes: a control i.e., no effect, a reducing and ligating agent for copper generating and binding the +2 state of the cation, and finally the desired behavior of a truly ligating agent for reduced copper.

Twenty nine candidates were evaluated as stabilizers on the surface of pure copper 1-5 um flakes. These candidates, as shown in FIG. 3, fall into three broad classes: no effect, reducing agents that are also $Cu^{2+}$ ligands and good ligands for $Cu^0$. The reaction conditions are 1.5 mmole Cu flakes, 3 mmole stabilizer in 1.35 mmole IPA and 3.35 mmole of carbitol at 40 degrees Celsuis. In the first class (no visible effect) we find the compounds: hydroxyl amine, hexamethylenetriamine, pyridine, ascorbic acid, histadine, arginine, Jeffamine T403, triethylamine, and triethanolamine. In the second category, wherein the compound reduced the surface oxide on the copper flakes and liganded with the resulting $Cu^{2+}$ ion to form a colored charge transfer complex we find: ethanolamine, Trishydroxymethylamino methane, N,N-dimethylethylenediamine, N,N, N'N' Tetramethylethylene diamine, EDTA, 1-amino 2-propanol, 3-amino1-propanol, both 1,2 and to a lesser extent 1,3-diaminopropane, 1,2-diaminocyclohexane, diethylenetriamine, and finally in the third, most desired, cateegory we find compounds that truly bind with reduced copper and these are: dimethylglyoxime, 1,4-diaminobutane, o-phenylendiamine, aniline, 2,2'-Bipyridine, 1,10-phenanthroline, and 8-hydroxy quinoline and to a lesser extent polyvinylpyrrolidone (PVP).

Example 4

Figure 4:
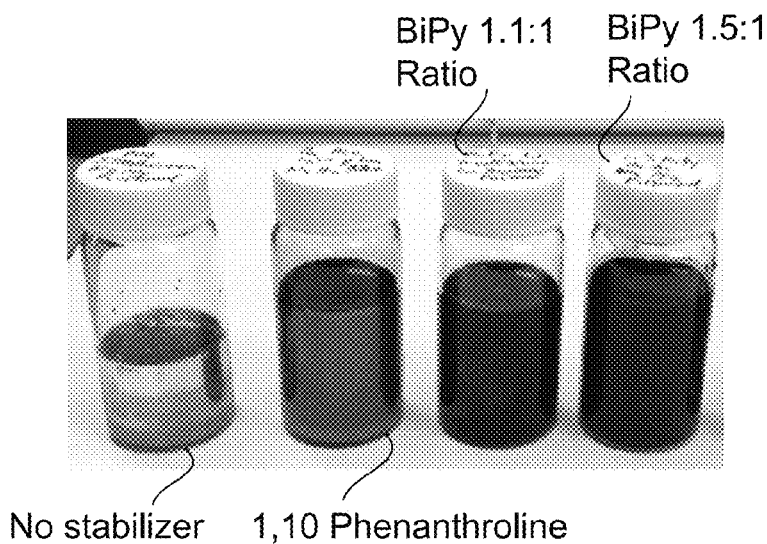
FIG. 4 depicts copper dispersions made with no stabilizer, 1,10-Phenanthroline and BiPY at two concentration levels (1.1:1 and 1.5:1 BiPY:copper) after setting for 24 hours.
Figure 5:
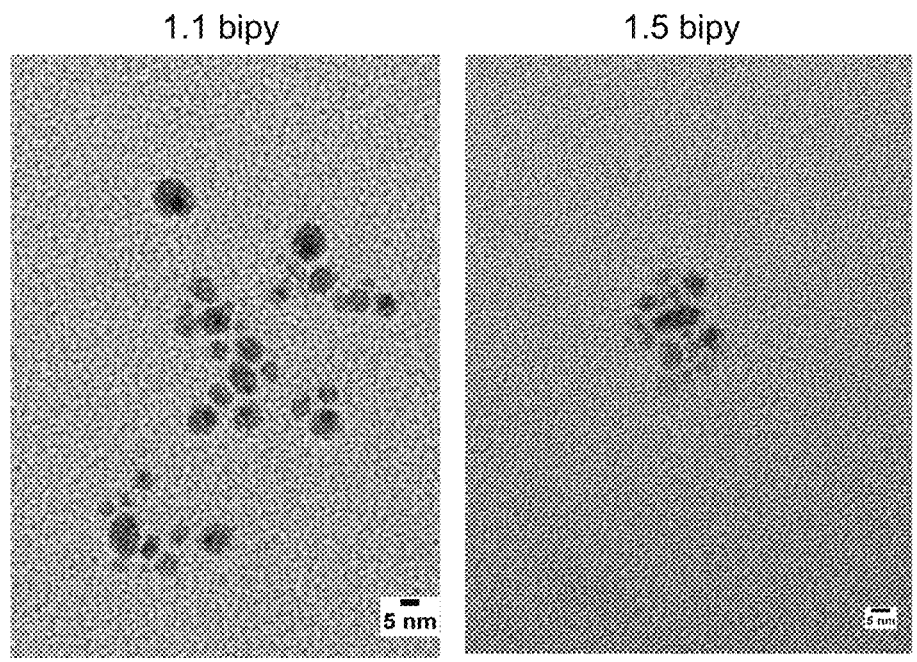
FIG. 5 depicts the TEM of 1.1:1 and 1.5:1 BiPY to Copper concentration ratio.

2.5 mmole of copper acetate (499.125 mg) were dissolved into eight ml of warm 18 megaohm deionized water. To this solution was added 2.25 ml of propylene glycol (final formulation 15%), 2.75 mmole of 1,10 phenanthroline stabilizer (495.3 mg) or, separately, two levels of BiPY stabilizer (585.7 mg BiPY for the 1.5:1 stabilize to copper ratio, or 780.9 mg for the 2.0:1 ratio). The copper was then reduced with 1 gm of $N_2H_4.H_2O$ solution (that is, 10 mmoles for a 4:1 ratio of reducer to copper) at room temperature. The results of this experiment are shown in FIG. 4. One day after the reaction was initiated, the non-stabilized copper dispersion printed out, the 1,10 phenanthroline stabilizer showed some hints of print out while the BiPY at two concentration levels (1.5:1 and 2:1 BiPY:copper) appeared stable over this time period. FIG. 5 is a transmission electron microscope (TEM) picture showing ~5 nm particles for the BIPY stabilized copper (1.5:1 and 2.0:1 BiPY:Copper concentration ratio).

Example 5

Figure 6A:
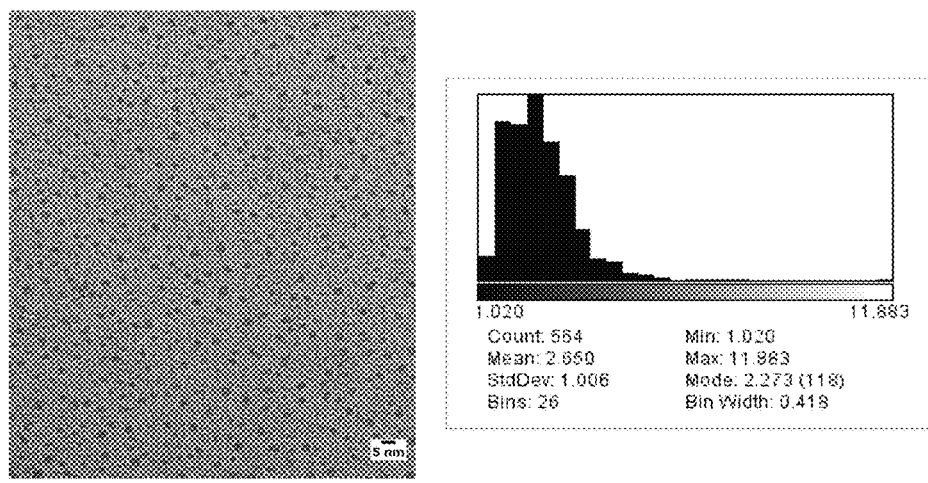
FIGS. 6A and 6B depict the 1,000,000×TEM, a size frequency distribution, high resolution image of a particle and its diffraction pattern (Selective Area Electron Diffraction SAED) for the reaction of copper formate with hydrazine in the presence of ethanolamine, high purity (HP) distilled water, 1-amino,2-propanol and 2,2'-BiPy.
Figure 6B:
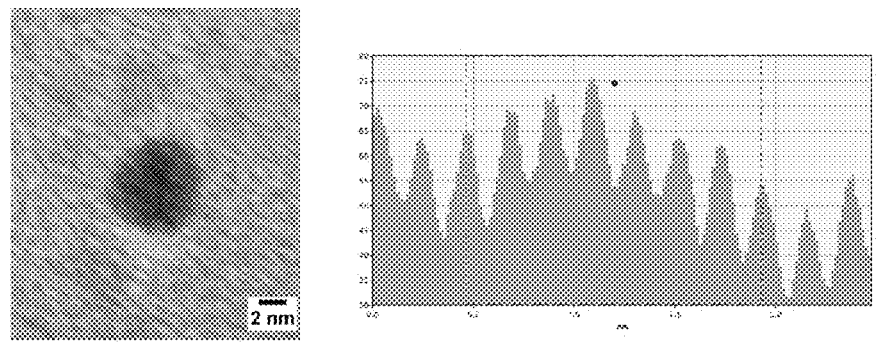

The effect of phenidone as a reducing agent and stabilizer was explored by reacting 2.5 mm of copper acetate (499.13 mg dissolved in 8 ml of hot 18 megaohm deionized water) with 2.75 mmole (445.96 mg) of Phenidone (a 10% stoichiometric excess) in a reaction media consisting of 2.25 ml (15%) propylene glycol and water. In FIGS. 6A and 6B, we see from the laser light scattering, i.e., tyndal effect, that particles are formed in both the BiPY free solution (left) and 2.75 mmole BiPY containing (dark vial on the right) reaction.

Example 6 (BW11)

In a 25 ml Erlenmeyer flask were placed 7.5 mmole copper formate 1.5 ml of ethanolamine, 1.55 ml of HP water, 1 ml of 1-amino, 2-propanol and 0.291 gm of 2,2' BiPy. This was reacted with an excess of hydrazine monohydrate for 2 minutes at 40 degrees Celsius. The temperature shot briefly to 65 degrees Celsius. The resultant dispersion was then filtered through a 0.2 micron filter placed on a TEM grid and imaged at 1,000,000×. This TEM, shown in FIG. 6A, along with the size frequency distribution indicates that the particles are 2.65 nm+/−1.0 nm. Other samples that were sized gave numbers of 2.18 nm+/−1.0, and 2.46 nm+/−1.0. The selective area electron Diffraction shown in FIG. 6B reveals a lattice spacing of 2.096 A which is within 0.4% of that of Cu (111) and definitely is not CuO or $Cu_2O$

Example 7

Figure 7:
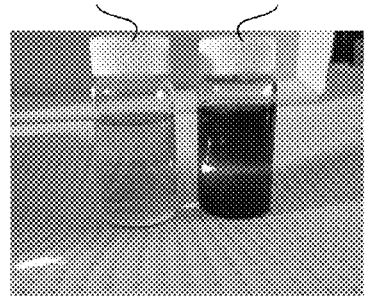
FIG. 7 depicts copper colloidal dispersion made by reduction of $Cu^{2+}$ with phenidone without and with BiPY stabilizer.

The next series of experiments were to test different reducing agents. Into each of four 20 ml scintillation vials were introduced 1.0 mmole of copper acetate (200 mg) dissolved into ethanol, followed by 1.5 mmole (235.6 mg) BiPY in ethanol (ratio of 1.5:1 stabilizer to copper). Four different reducing agents: hydrazine monohydrate, ascorbic acid, sodium borohydride and phenidone were then introduced separately into their respectively labeled vials. Reducing agent concentrations were ten times that needed for a stoichiometric reaction. A Pro 250 mixer was used to agitate the reaction which was carried out under an argon blanket at 60 degrees Celsius. The colloids were then filtered through a 0.2 micron filter. Pictures of the vials were taken after five days and are shown in FIG. 7. Ascorbic acid gave the coarsest dispersion. Hydrazine, borohydride and phenidone gave very good dispersions that were easily filtered through a 200 nm filter.

Example 8

Figure 9:
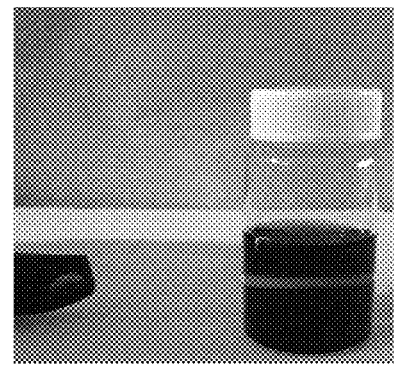
FIG. 9 depicts copper colloidal dispersions made with hydrazine BiPY in water, isopropyl alcohol and propylene glycol.
Figure 8:
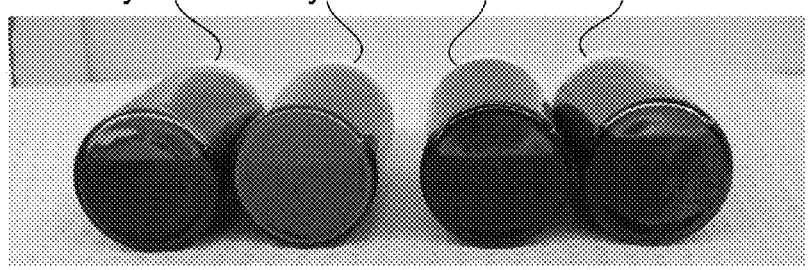
FIG. 8 depicts five day keeping on copper colloidal dispersions made in BiPY using four different reducing agents: hydrazine, ascorbic acid, sodium borohydride and phenidone.

FIG. 8 depicts a freshly made copper colloidal dispersion made by the reduction of 1 mmole (200 mg) copper acetate by 0.5 ml of a 35% aq hydrazine solution. The reaction media contains 171.1 mg of the stabilizer BiPY (1.1 mmole of stabilizer), six ml of isopropyl alcohol and 2.25 ml of propylene glycol. The initial reaction product, as shown in FIG. 9, unfortunately, prints out a metallic copper mirror coating after several days indicating that this level of stabilizer is inadequate to impart long shelf life stability.

Figure 10A:
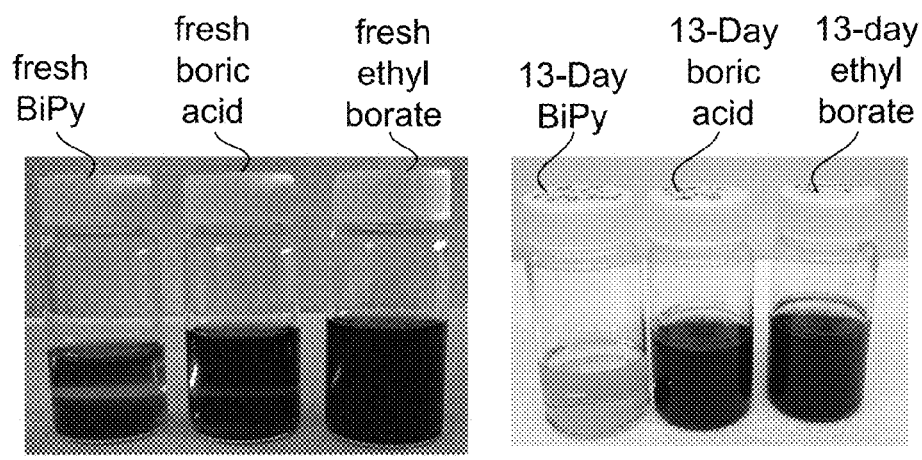
FIG. 10A depicts copper colloidal dispersions stabilized with: BiPy, boric acid, and ethyl borate both fresh and 13 day room temperature keeping.

FIG. 10A depicts the relative stabilities of copper colloidal dispersions stabilized with: BiPY, boric acid, and ethyl borate. Aaliquoits of 0.33 mmole a 1 mmole copper acetate solution in 12 ml of ethanol at 55 degrees Celsius that had been reduced by an excess of hydrazine were placed into three separate 20 ml scintillation vials. To quench particle growth and stabilize the copper nanoparticles, three candidate stabilizers were used. To the first vial was added 0.50 mmole of BiPY (in ethanol), to the second vial was added 0.5 mmole of boric acid (in ethanol) and to the third vial 0.50 mmole of ethyl borate (in ethanol). While all stabilizers successfully produced nano copper dispersions (see FIG. 10A), it was only the boric acid and ethyl borate that showed good 13 day stability.

Figure 10B:
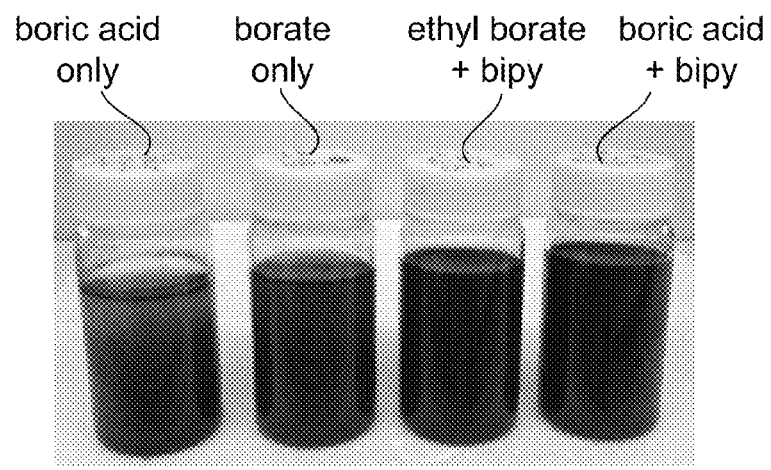
FIG. 10B depicts copper colloidal dispersions stabilized with: boric acid only, borate only, boric acid+BiPY, and ethyl borate+BiPY.

FIG. 10B depicts the results of the above experiment with the first two vials representing 1 mmole of copper acetate reduced by excess hydrazine and after a five minute wait at 55 degrees Celsius, quenched with 1.5 mmole of boric acid or ethyl borate. The third and fourth vials represent the same copper reduction done only in the presence of 0.5 mmole BiPY and then quenched after five minutes with either 0.75 mmole of ethyl borate or 0.75 mmole of boric acid. The boric (acid or ethyl borate) combinations with BiPY are clearly superior for dispersion characteristics such as lack of settling.

Thus, there is provided a stable, fully reduced metallic copper nanoparticle-containing colloidal dispersion with a uniform and mean particle size less than 10, and preferably less than 3 nm synthesized by a facile, low temperature solvent process which comprises the basic steps of: initially forming a copper salt charge transfer complex (CT complex) of an amino alcohol or diamine moiety with a copper salt; then reacting, sometimes to completion, the CT complex with a solution comprising a two or three nitrogen atom-containing organic reducing agent to form copper particles; and finally stabilizing the copper particles with aniline or a bi-dentate nitrogen atom containing stabilizer (Lewis base) to form the stable, fully reduced metallic copper nanoparticle-containing colloidal dispersion. In this process, the CT complex results from the reaction of a copper formate, acetate or citrate salt dissolved in at least two solvents selected from the group consisting of monoethanolamine, di-ethanolamine, tri-ethanolamine, 1,2-aminopropanol, 1,3-aminopropanol, or combinations thereof. The two or three nitrogen atom containing reducing agent is selected from the group consisting of diethylenetriamine, 1,2-diaminocyclohexane, hydrazine, derivatized hydrazine molecule or phenidone-like molecule. The bi-dentate nitrogen or hetero atom-containing amine stabilizer is selected from the group consisting of dimethyl glyoxime, 2,2'-bipyridine, 1,10-phenanthroline, ortho-phenylenediamine, 1,2-diaminocyclohexane, 1,4-diamino butane, urea, substituted urea, and combinations thereof. Preferably, the process is a one-pot process.

In one embodiment, the CT complex results from the reaction of a copper formate, acetate or citrate salt dissolved in at least two solvents selected from the group consisting of monoethanolamine, di-ethanolamine, tri-ethanolamine, 1,2-aminopropanol, 1,3-aminopropanol, or combinations thereof.

In one embodiment, the process further comprises a step of concentrating the stable, fully reduced metallic copper nanoparticle-containing colloidal dispersion by removing at least a portion of a volatile low molecular weight solvent.

In one embodiment, the bidentate organic amine or diamine is present during the reduction. In another embodiment, the bidentate organic amine or diamine is introduced post reduction.

In one embodiment, a Lewis acid such as a boric acid or organic borate is introduced post reduction. In another embodiment, the solvent is removed by partial vacuum distillation, ultrafiltration, chemical extraction into another phase or complexation.

In one embodiment, the steps of reacting, reducing and/or exhausting, stabilizing and concentrating occur at a temperatures less than 60 degrees Celsius.

In one embodiment, the reducing agent has at least two nitrogen atoms that are in spatial proximity of less than four atoms preferably adjacently located.

In one embodiment, the low molecular weight solvent is a low molecular weight solvent selected from the group consisting of water, methanol, ethanol, ethanolamine, mono, di and tri-ethanol amine, methoxy propanol, 1-amino 2-propanol, 1-amino 3-propanol, 1,2-diamio propane, 1,3-di-amino propane and combinations thereof.

In one embodiment, the dispersion is deposited on a substrate wherein the substrate-dispersion combination form an electrically or thermally conductive component selected from the group comprising an antenna, waveform, RFID, and active component of an electrical device.

The process has been described in detail with particular reference to certain preferred embodiments thereof, but it will be understood that variations and modifications can be effected within the spirit and scope of the process.

The detailed description refers to the accompanying drawings that show, by way of illustration, specific aspects and embodiments in which the present disclosed embodiments may be practiced. These embodiments are described in sufficient detail to enable those skilled in the art to practice aspects of the present process. Other embodiments may be utilized, and changes may be made without departing from the scope of the disclosed embodiments. The various embodiments can be combined with one or more other embodiments to form new embodiments. The detailed description is, therefore, not to be taken in a limiting sense, and the scope of the present process is defined only by the appended claims, with the full scope of equivalents to which they may be entitled. It will be appreciated by those of ordinary skill in the art that any arrangement that is calculated to achieve the same purpose may be substituted for the specific embodiments shown. This application is intended to cover any adaptations or variations of embodiments of the present process. It is to be understood that the above description is intended to be illustrative, and not restrictive, and that the phraseology or terminology employed herein is for the purpose of description and not of limitation. Combinations of the above embodiments and other embodiments will be apparent to those of skill in the art upon studying the above description. The scope of the present disclosed embodiments includes any other applications in which embodiments of the above structures and fabrication methods are used. The scope of the embodiments should be determined with reference to the appended claims, along with the full scope of equivalents to which such claims are entitled.

What is claimed herein is:

1. A stable, fully reduced metallic copper nanoparticle-containing colloidal dispersion with a uniform and mean particle size less than about 2.9 nm wherein said metallic copper nanoparticle has an organic surface comprising at least two nitrogen containing ligands in an aromatic structure and wherein said colloidal dispersion is synthesized by a facile, low temperature solvent process comprising the steps of:
    forming a copper salt charge transfer complex (CT complex) of an amino alcohol or diamine moiety with a copper salt;
    reacting the CT complex with a solution comprising a two or three nitrogen atom-containing organic reducing agent via a reduction reaction to form copper particles; and
    stabilizing the copper particles with aniline or a bi-dentate hetero atom containing amine stabilizer (Lewis base) to form the stable, fully reduced metallic copper nanoparticle-containing colloidal dispersion,
    wherein:
        the CT complex results from the reaction of a copper formate, acetate or citrate salt dissolved in at least two solvents selected from the group consisting of mono-ethanolamine, di-ethanolamine, tri-ethanolamine, 1,2-aminopropanol, 1,3-aminopropanol, or combinations thereof;
        the two or three nitrogen atom containing reducing agent is selected from the group consisting of diethylenetriamine, 1,2-diaminocyclohexane, hydrazine, derivatized hydrazine molecule or phenidone-like molecule; and
        the bi-dentate hetero atom-containing amine stabilizer is selected from the group consisting of dimethyl glyoxime, 2,2'-bipyridine, 1,10-phenanthroline, ortho-phenylenediamine, 1,2-diaminocyclohexane, 1,4-diamino butane, 8-hydroxyquinoline, and combinations thereof.

2. The stable, fully reduced metallic copper nanoparticle-containing colloidal dispersion of claim 1, wherein the step of forming the CT complex comprises a reaction of a copper formate, acetate or citrate salt dissolved in a diamine, 1,2 or 1,3-diamino propane or 1,2-diaminocyclohexane.

3. The stable, fully reduced metallic copper nanoparticle-containing colloidal dispersion of claim 1, wherein the process further comprises a step of concentrating the stable, fully reduced metallic copper nanoparticle-containing colloidal dispersion to a concentration of from about 5% to about 85% by weight by removing at least a portion of a volatile low molecular weight solvent.

4. The stable, fully reduced metallic copper nanoparticle-containing colloidal dispersion of claim 1, wherein the process is a one-pot process.

5. The stable, fully reduced metallic copper nanoparticle-containing colloidal dispersion of claim 1, wherein at least one of the bidentate organic amine and diamine is present during the reduction reaction.

6. The stable, fully reduced metallic copper nanoparticle-containing colloidal dispersion of claim 1, wherein at least one of the bidentate organic amine or diamine is introduced post reduction reaction.

7. The stable, fully reduced metallic copper nanoparticle-containing colloidal dispersion of claim 1, wherein a Lewis acid is introduced post reduction.

8. The stable, fully reduced metallic copper nanoparticle-containing colloidal dispersion of claim 1, wherein the solvent is removed by a process selected from the group consisting of partial vacuum distillation, ultrafiltration, chemical extraction into another phase, complexation and combinations thereof.

9. The stable, fully reduced metallic copper nanoparticle-containing colloidal dispersion of claim 1, wherein at least one of the steps of reacting, reducing, stabilizing and concentrating occurs at applied temperatures less than about 60 degrees Celsius.

10. The stable, fully reduced metallic copper nanoparticle-containing colloidal dispersion of claim 1, wherein the reducing agent has at least two nitrogen atoms that are in spatial proximity of less than four atoms removed.

11. The stable, fully reduced metallic copper nanoparticle-containing colloidal dispersion of claim 10, wherein the reducing agent has at least two nitrogen atoms that are adjacently located.

12. The stable, fully reduced metallic copper nanoparticle-containing colloidal dispersion of claim 1, wherein the low molecular weight solvent is a low molecular weight solvent selected from the group consisting of water, methanol, ethanol, mono, di and tri-ethanol amine, methoxy propanol, 1-amino 2-propanol, 1-amino 3-propanol, 1,2-diamino propane, 1,3-diamino propane and combinations thereof.

13. The stable, fully reduced metallic copper nanoparticle-containing colloidal dispersion of claim 1, wherein the dispersion is deposited on a substrate wherein the substrate-dispersion combination form an electrically or thermally conductive component selected from the group consisting of an antenna, waveform, Radio Frequency Identification (RFID), and active component of an electrical device.

14. A process for producing a stable, fully reduced metallic copper nanoparticle-containing colloidal dispersion with a uniform and mean particle size less than 2.9 nm, said process comprising the steps of:
    forming a copper salt charge transfer complex (CT complex) of an amino alcohol or diamine moiety with a copper salt;

reacting the CT complex with a solution comprising a two or three nitrogen atom-containing organic reducing agent via a reduction reaction to form copper particles; and stabilizing the copper particles with aniline or a bi-dentate hetero atom containing amine stabilizer (Lewis base) to form the stable, fully reduced metallic copper nanoparticle-containing colloidal dispersion, wherein:
the CT complex results from the reaction of a copper formate, acetate or citrate salt dissolved in at least two solvents selected from the group consisting of mono-ethanolamine, di-ethanolamine, tri-ethanolamine, 1,2-aminopropanol, 1,3-aminopropanol, or combinations thereof;

the two or three nitrogen atom containing reducing agent is selected from the group consisting of diethylenetriamine, 1,2-diaminocyclohexane, hydrazine, derivatized hydrazine molecule or phenidone-like molecule; and the bi-dentate hetero atom-containing amine stabilizer is selected from the group consisting of dimethyl glyoxime, 2,2'-bipyridine, 1,10-phenanthroline, ortho-phenylenediamine, 1,2-diaminocyclohexane, 1,4-diamino butane, 8-hydroxyquinoline, and combinations thereof.

15. The process of claim 14, wherein the step of forming the CT complex comprises a reaction of a copper formate, acetate or citrate salt dissolved in a diamine, 1,2 or 1,3-diamino propane or 1,2-diaminocyclohexane.

16. The process of claim 14, wherein the process further comprises a step of concentrating the stable, fully reduced metallic copper nanoparticle-containing colloidal dispersion to a concentration of from about 5% to about 85% by weight by removing at least a portion of a volatile low molecular weight solvent.

17. The process of claim 14, wherein the process is a one-pot process.

18. The process of claim 14, wherein the solvent is removed by a process selected from the group consisting of partial vacuum distillation, ultrafiltration, chemical extraction into another phase, complexation and combinations thereof.

19. The process of claim 14, wherein at least one of the steps of reacting, reducing, stabilizing and concentrating occurs at applied temperatures less than 60 degrees Celsius.

20. The process of claim 14, wherein the reducing agent has at least two nitrogen atoms that are in spatial proximity of less than four atoms removed.

21. The process of claim 20, wherein the reducing agent has at least two nitrogen atoms that are adjacently located.

22. The process of claim 14, wherein the low molecular weight solvent is a low molecular weight solvent selected from the group consisting of water, methanol, ethanol, mono, di and tri-ethanol amine, methoxy propanol, 1-amino 2-propanol, 1-amino 3-propanol, 1,2 diamino propane, 1,3-diamino propane and combinations thereof.

23. A process for producing a stable, fully reduced metallic copper nanoparticle-containing colloidal dispersion with a uniform and mean particle size less than 2.9 nm, said process comprising the steps of:

forming a copper salt charge transfer complex (CT complex) of an amino alcohol or diamine moiety with a copper salt;

reacting the CT complex with a solution comprising a two or three nitrogen atom-containing organic reducing agent via a reduction reaction to form copper particles; and stabilizing the copper particles with aniline or a bi-dentate hetero atom containing amine stabilizer (Lewis base) to form the stable, fully reduced metallic copper nanoparticle-containing colloidal dispersion, wherein:
the CT complex results from the reaction of a copper formate, acetate or citrate salt dissolved in at least two solvents selected from the group consisting of mono-ethanolamine, di-ethanolamine, tri-ethanolamine, 1,2-aminopropanol, 1,3-aminopropanol, or combinations thereof;

the two or three nitrogen atom containing reducing agent is selected from the group consisting of diethylenetriamine, 1,2-diaminocyclohexane, hydrazine, derivatized hydrazine molecule or phenidone-like molecule; and the bi-dentate hetero atom-containing amine stabilizer is selected from the group consisting of dimethyl glyoxime, 2,2'-bipyridine, 1,10-phenanthroline, ortho-phenylenediamine, 1,2-diaminocyclohexane, 1,4-diamino butane, 8-hydroxyquinoline, and combinations thereof; and wherein at least one of the bidentate organic amine and diamine is present during the reduction reaction.

24. A process for producing a stable, fully reduced metallic copper nanoparticle-containing colloidal dispersion with a uniform and mean particle size less than 2.9 nm, said process comprising the steps of:

forming a copper salt charge transfer complex (CT complex) of an amino alcohol or diamine moiety with a copper salt;

reacting the CT complex with a solution comprising a two or three nitrogen atom-containing organic reducing agent via a reduction reaction to form copper particles; and stabilizing the copper particles with aniline or a bi-dentate hetero atom containing amine stabilizer (Lewis base) to form the stable, fully reduced metallic copper nanoparticle-containing colloidal dispersion, wherein:
the CT complex results from the reaction of a copper formate, acetate or citrate salt dissolved in at least two solvents selected from the group consisting of mono-ethanolamine, di-ethanolamine, tri-ethanolamine, 1,2-aminopropanol, 1,3-aminopropanol, or combinations thereof;

the two or three nitrogen atom containing reducing agent is selected from the group consisting of diethylenetriamine, 1,2-diaminocyclohexane, hydrazine, derivatized hydrazine molecule or phenidone-like molecule; and the bi-dentate hetero atom-containing amine stabilizer is selected from the group consisting of dimethyl glyoxime, 2,2'-bipyridine, 1,10-phenanthroline, ortho-phenylenediamine, 1,2-diaminocyclohexane, 1,4-diamino butane, 8-hydroxyquinoline, and combinations thereof; and wherein at least one of the bidentate organic amine and diamine is introduced post reduction.

25. A process for producing a stable, fully reduced metallic copper nanoparticle-containing colloidal dispersion with a uniform and mean particle size less than 2.9 nm, said process comprising the steps of:

forming a copper salt charge transfer complex (CT complex) of an amino alcohol or diamine moiety with a copper salt;

reacting the CT complex with a solution comprising a two or three nitrogen atom-containing organic reducing agent via a reduction reaction to form copper particles; and stabilizing the copper particles with aniline or a bi-dentate hetero atom containing amine stabilizer (Lewis base) to form the stable, fully reduced metallic copper nanoparticle-containing colloidal dispersion, wherein:

the CT complex results from the reaction of a copper formate, acetate or citrate salt dissolved in at least two solvents selected from the group consisting of mono-ethanolamine, di-ethanolamine, tri-ethanolamine, 1,2-aminopropanol, 1,3-aminopropanol, or combinations thereof;

the two or three nitrogen atom containing reducing agent is selected from the group consisting of diethylenetriamine, 1,2-diaminocyclohexane, hydrazine, derivatized hydrazine molecule or phenidone-like molecule; and the bi-dentate hetero atom-containing amine stabilizer is selected from the group consisting of dimethyl glyoxime, 2,2'-bipyridine, 1,10-phenanthroline, ortho-phenylenediamine, 1,2-diaminocyclohexane, 1,4-diamino butane, 8-hydroxyquinoline, and combinations thereof; and wherein a Lewis acid is introduced post reduction.

26. A stable, fully reduced metallic copper nanoparticle-containing colloidal dispersion with a uniform and mean particle size less than about 2.9 nm wherein said metallic copper nanoparticle has an organic surface comprising at least two nitrogen containing ligands in an aromatic structure.

* * * * *